(12) United States Patent
Rye et al.

(10) Patent No.: US 9,812,344 B2
(45) Date of Patent: Nov. 7, 2017

(54) WAFER PROCESSING SYSTEM WITH CHUCK ASSEMBLY MAINTENANCE MODULE

(71) Applicant: APPLIED Materials, Inc., Santa Clara, CA (US)

(72) Inventors: Jason Rye, Kalispell, MT (US); Mario David Silvetti, Morgan Hill, CA (US); Randy A. Harris, Kalispell, MT (US); Bryan Puch, Kalispell, MT (US); Vincent Steffan Francischetti, Columbia Falls, MT (US); Satish Sundar, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 174 days.

(21) Appl. No.: 14/613,081

(22) Filed: Feb. 3, 2015

(65) Prior Publication Data

US 2016/0225656 A1 Aug. 4, 2016

(51) Int. Cl.
*H01L 21/00* (2006.01)
*H01L 21/677* (2006.01)
*B08B 3/02* (2006.01)
*H01L 21/687* (2006.01)

(52) U.S. Cl.
CPC .......... *H01L 21/67751* (2013.01); *B08B 3/02* (2013.01); *H01L 21/68721* (2013.01); *B08B 2203/0229* (2013.01)

(58) Field of Classification Search
None
See application file for complete search history.

(56) References Cited

U.S. PATENT DOCUMENTS

| 5,516,412 | A | 5/1996 | Andricacos et al. |
| 8,277,624 | B2 | 10/2012 | Keigler et al. |
| 8,486,234 | B2 | 7/2013 | Saito et al. |
| 2006/0102078 | A1 | 5/2006 | Fairbairn et al. |
| 2011/0036722 | A1 | 2/2011 | Yoshioka et al. |
| 2013/0020284 | A1 | 1/2013 | Osada et al. |

(Continued)

FOREIGN PATENT DOCUMENTS

WO 2014-201627 A1 12/2014

OTHER PUBLICATIONS

Korean Intellectual Property Office, The International Search Report and The Written Opinion issued in International Application No. PCT/US2016/013892 dated Apr. 25, 2016.

*Primary Examiner* — Michael Barr
*Assistant Examiner* — Jason Riggleman
(74) *Attorney, Agent, or Firm* — Perkins Coie LLP; Kenneth H. Ohriner

(57) ABSTRACT

A wafer processing system has a ring maintenance module for loading wafers into a chuck assembly, and for cleaning and inspecting the chuck assembly used in electroplating processors of the system. A shaft is attached to a rotor plate. A rotation motor rotates the shaft and a rotor plate on the shaft. A chuck clamp on an upper end of the shaft holds the chuck assembly onto the rotor plate. A lift motor raises and lowers the rotor plate and the shaft, to move open the chuck assembly for wafer loading and unloading, and to move the chuck assembly into different process positions. A swing arm having spray nozzles may be provided for cleaning the chuck assembly.

18 Claims, 11 Drawing Sheets

(56) References Cited

U.S. PATENT DOCUMENTS

2014/0248774 A1 9/2014 Aiura et al.
2014/0318977 A1* 10/2014 Moore .................. C25D 17/06
 205/157
2014/0352726 A1 12/2014 Itoh et al.

* cited by examiner

WAFER PROCESSING SYSTEM WITH CHUCK ASSEMBLY MAINTENANCE MODULE

BACKGROUND OF THE INVENTION

Microelectronic devices are generally formed on a semiconductor wafer or other type substrate or workpiece. In a typical manufacturing process, one or more thin metal layers are formed on a wafer to produce microelectronic devices and/or to provide conducting lines between devices.

The metal layers are generally applied to the wafers via electrochemical plating in an electroplating processor. A typical electroplating processor includes a vessel for holding an electroplating solution, one or more anodes in the bowl in contact with the electroplating solution, and a head having a contact ring with multiple electrical contacts that touch the wafer. The front surface of the workpiece is immersed in the electroplating solution and an electrical field causes metal ions in the electroplating solution to plate out onto the wafer, forming a metal layer.

So-called dry contact electroplating processors use a seal to keep the plating solution away from portions of the contacts. The seal must be periodically cleaned to work effectively and avoid contaminating the workpiece. The need to maintain the contacts and the seal reduces the throughput or use efficiency of the electroplating system. Accordingly, improved designs are needed.

SUMMARY OF THE INVENTION

A wafer processing system has a ring maintenance module for loading wafers into a chuck assembly, and for cleaning and inspecting the chuck assembly used in electroplating processors of the system. The ring maintenance module may include a lift assembly within an enclosure. A lift motor raises and lowers the lift assembly. A shaft is attached to a rotor plate. A chuck clamp is attached to an upper end of the shaft. A swing arm having spray nozzles may be provided for cleaning the chuck assembly. The ring maintenance module may load and unload a wafer into a chuck assembly, clean the chuck assembly, and optionally conduct a pressure check on, and an automated visual inspection of, a ring seal on a contact ring of the chuck assembly.

DETAILED DESCRIPTION OF THE DRAWINGS

Figure 1:
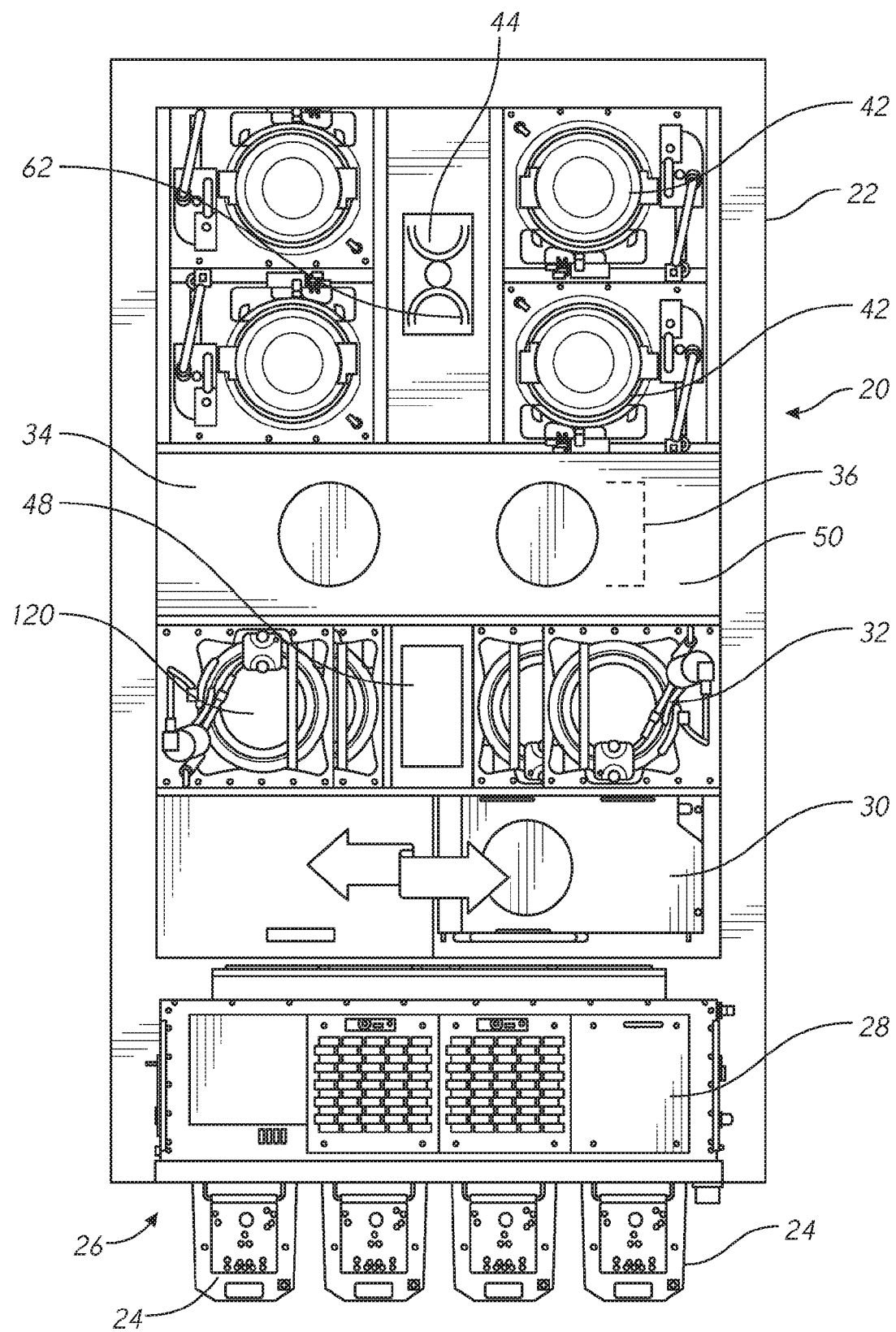
FIG. 1 is a schematic plan view of a processing system.

As shown in FIG. 1, a processing system 20 includes modules or subsystems mounted on a horizontal deck 34 within an enclosure 22. Wafer or substrate containers 24 may be docked at a load/unload station 26 at the front of the enclosure 22. The subsystems used may vary with the specific manufacturing processes performed by the system 20. In the example shown, the system 20 includes a front interface 28, which may provide temporary storage for wafers to be moved into or out of the system 20, as well as optionally providing other functions. One of more ring maintenance modules 50 and electroplating processors 42 are arranged with the enclosure 22 behind the front interface 28. An anneal module 30 and rinse/dry modules 32 may also be provided.

Robots move wafers 114 between the subsystems. For example, a wafer robot 48 may be positioned to move wafers between one or more of the anneal module 30 and the rinse/dry module 32 to the ring maintenance module 50. A process robot 44 is positioned to move a chuck assembly holding a wafer between a ring maintenance module 50 and an electroplating processor 42. In a basic form the system 20 may include only electroplating processors 42 and a ring maintenance module 50.

Figure 2:
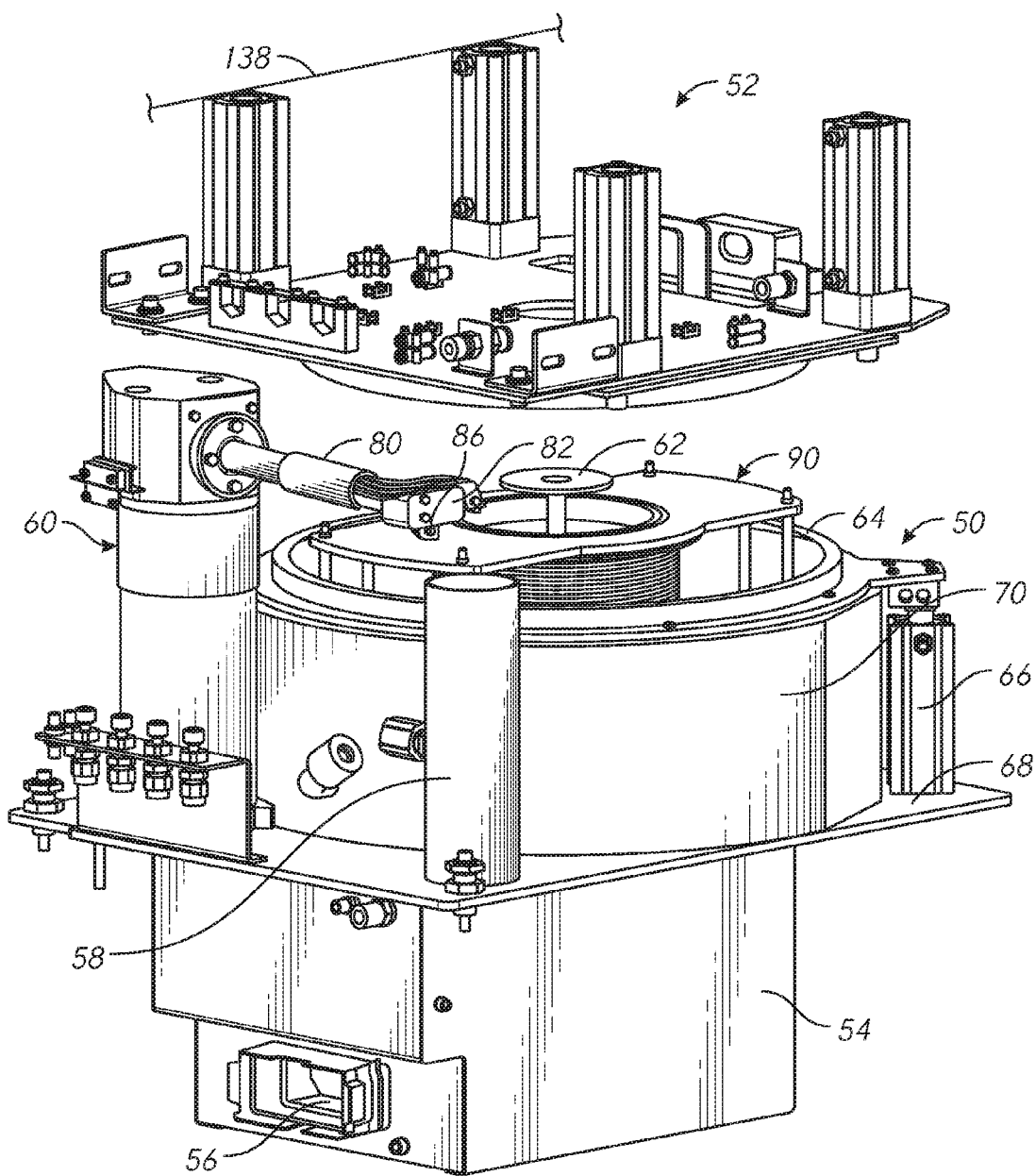
FIG. 2 is a front, top and left side perspective view of one of the ring maintenance modules shown in FIG. 1.
Figure 3:
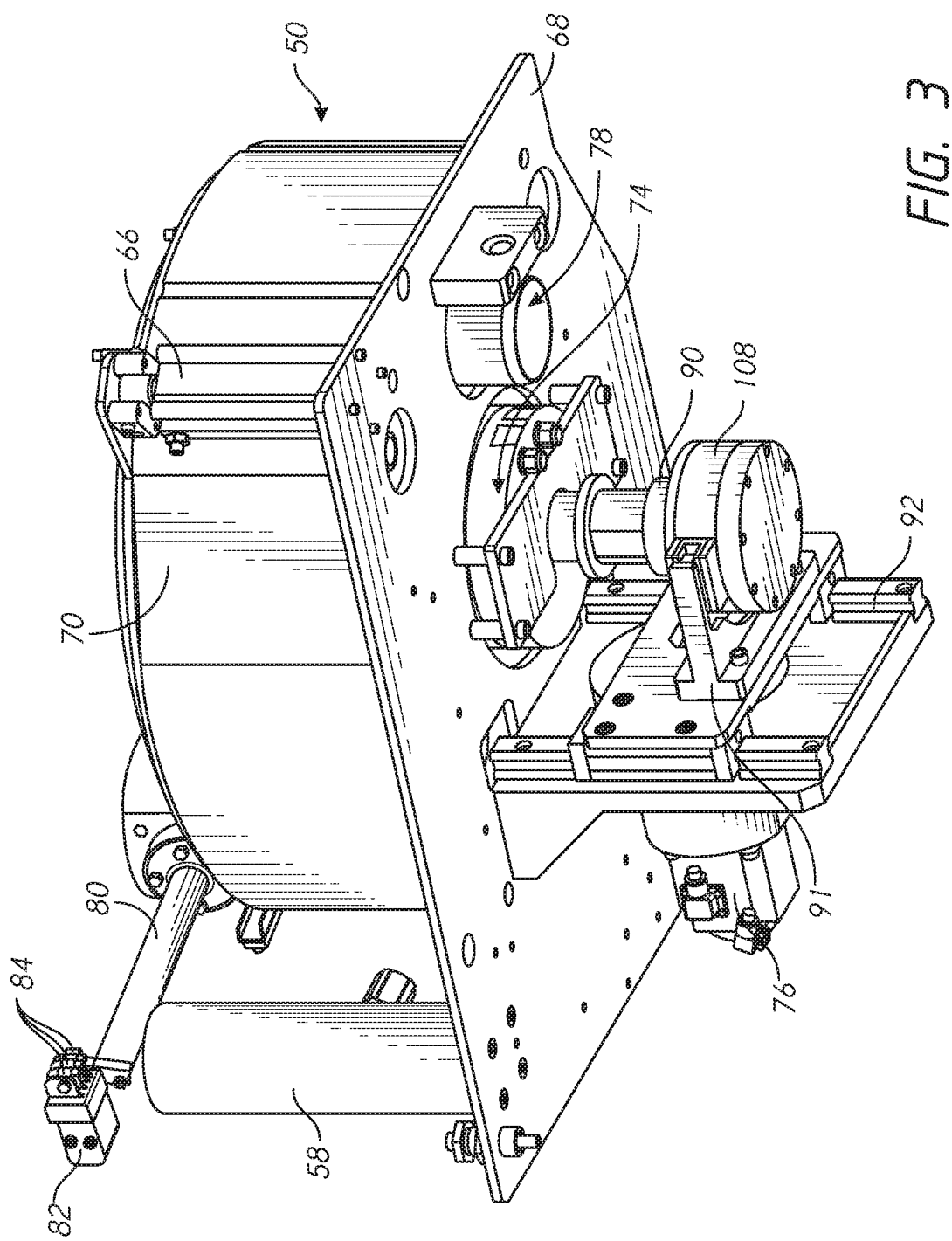
FIG. 3 is a bottom, rear and right side perspective view of the ring maintenance module shown in FIG. 2, with the bottom cover removed.

As shown in FIGS. 2 and 3, the ring maintenance module 50 has a base plate 68 which may be supported on the deck 34. An enclosure 70 is attached to base plate 68. A spin motor 74 and a lift motor 76 are positioned below the base plate 68. An electrical connector 56 provides power to the motors 74 and 76 from a cable routed below the deck 34. A swing arm assembly 60 and a dispense cup 58 are supported on opposite corners of the base plate 68. An annular weir 64 is positioned within the enclosure 70 and may be moved vertically via weir lift actuators 66. An optional seal test assembly 52 may be supported on the cabinet 138 of the enclosure 22 aligned over the ring maintenance module 50. Referring still to FIGS. 2 and 3, a swing arm 80 on the swing arm assembly 60 has one or more spray nozzles 84 on a spray head 82. A brush 86 may also optionally be provided on the spray head 82.

Figure 4:
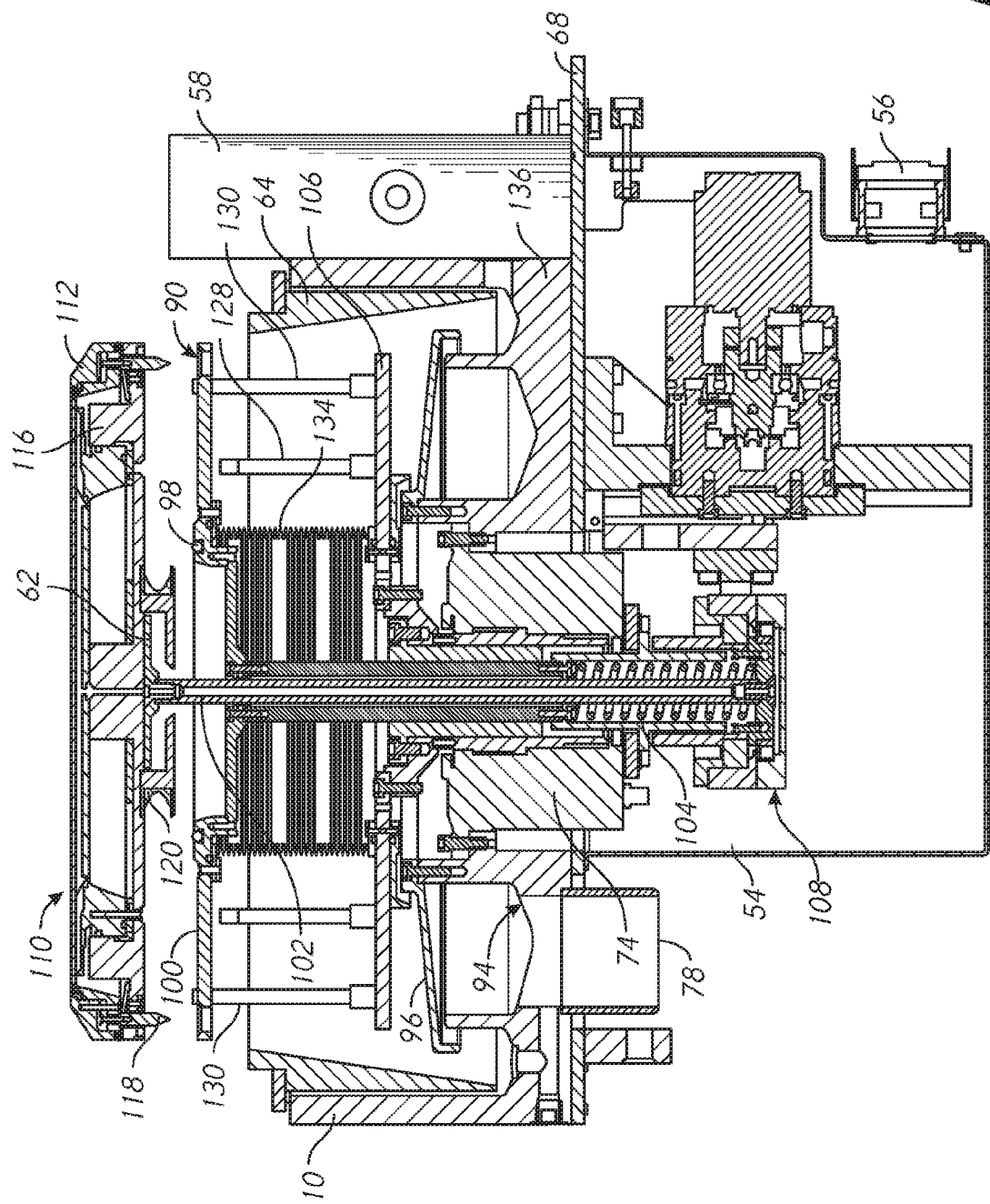
FIG. 4 is a section view of the ring maintenance module shown in FIGS. 2 and 3 in a chuck assembly load and unload position.

As shown in FIG. 4, an exhaust and drain pipe 78 passes through the base plate 68 and connects to a drain channel 94 in a base 136 of the ring maintenance module 50. The spin motor 74 spins a shaft 102, with a chuck clamp 62 attached to the top end of the shaft 102.

A tension spring 104 pulls the shaft 102 down. A lower rotor plate 106 is rigidly attached to the shaft 102. Wafer standoffs 128 fixed to the lower rotor plate 106 are aligned with inner clearance holes in the upper rotor plate 100. Similarly, contact ring standoffs 130 are aligned with outer clearance holes in the upper rotor plate 100.

Referring to FIGS. 3 and 4, the upper rotor plate 100 rotates with the shaft 102 and the lower rotor plate 106, and is vertically displaceable relative to the lower rotor plate 106. The lift motor 76 drives a transom 91 vertically on a track 92 attached to the base plate 68. A shaft cup 108 is supported on the transom 91 and shifts vertically with the transom 91. When actuated, the lift motor 76 moves the transom up or down, which correspondingly moves the shaft 102 and the upper plate 100 vertically. The lift motor 76, the transom 91, the shaft cup 108 and the shaft 102 together form a lift assembly generally indicated at 90, which lifts and lowers the upper rotor plate 100. The lower rotor plate 106 rotates with the shaft and the upper rotor plate, but the lower rotor plate 106 is at a fixed vertical position. The wafer stand offs 128 and the contact ring standoffs 130 are rigidly attached to the lower rotor plate 106 have fixed lengths.

As shown in FIG. 4, a spray cap 96 is attached to the base 136 of the ring maintenance module 50 over the drain channel 94 leading to the exhaust and drain pipe 78. A bellows 134 may connect the upper and lower rotor plates 100 and 106, with the bellows 134 and spray cap 96 helping to keep process liquids away from the motors 74 and 76 and internal components.

The electrochemical plating processors 42 electroplate a conductive film onto a wafer 114, while the wafer is held within a chuck assembly 110. This allows maintenance functions to be performed in the ring maintenance module 50, rather than in the processors 42. As a result, the productivity of the system 20 is increased because the processors 42 can operate substantially continuously, without delays required for contact ring maintenance.

Figure 5:
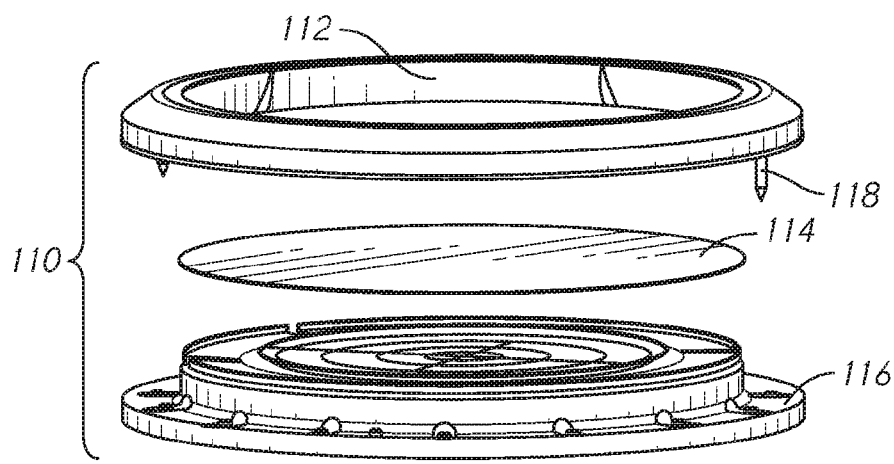
FIG. 5 is an exploded side perspective view of the chuck assembly shown in FIG. 4
Figure 6:
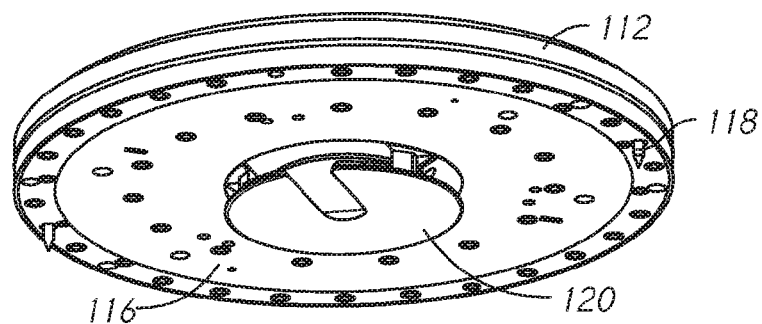
FIG. 6 is a bottom perspective view of the chuck assembly of FIG. 5.

A chuck assembly 110, as shown in FIGS. 5 and 6, has a contact ring 112 and a backing plate 116. The contact ring 112 may contain magnets for holding the contact ring onto the backing plate 116, with a wafer 114 between them.

Figure 7:
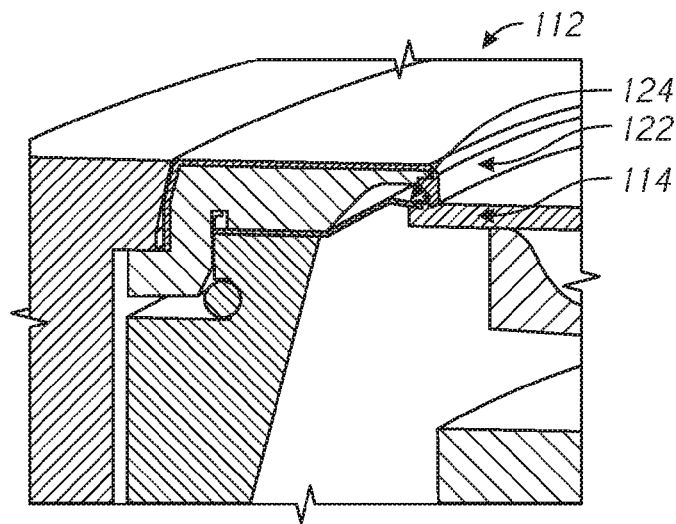
FIG. 7 is an enlarged perspective section view of the contact ring of the chuck assembly shown in FIGS. 5 and 6.

A chuck fitting 120 is attached to the back side of the backing plate 116. The chuck clamp 62 at the top of the shaft 102 engages the chuck fitting 120. Alignment pins 118 on the contact ring 112 are used to align the chuck assembly 110 with a rotor in the plating processor 42. When placed in the processor 42, the chuck assembly 110 is inverted from the position shown in FIGS. 5 and 6. As shown in FIG. 7, the contact ring 112 has a large number of contact fingers 124 adapted to make electrical contact with a seed layer on the wafer 114, around the outer perimeter of the wafer. Typically, the contact fingers touch the wafer about 1 to 3 mm in from the edge of the wafer. A seal 122 on the contact ring seals against the wafer during electroplating, to seal the electrolyte away from the contact fingers 124, providing a so-called dry contact ring. The contact fingers 124 and the seal 122 may be similar to or the same as those used in known electrochemical processing processors.

The ring maintenance module 50 may operate to load and unload a wafer 114 into and out of the chuck assembly 110, and also to perform maintenance functions including clean, rinse and drying of the chuck assembly. The ring maintenance module 50 may also conduct a seal pressure check to identify whether a ring contact seal of a chuck assembly 110 can adequately seal against a wafer. The ring maintenance module may also optionally provide an optical seal inspection.

Figure 8:
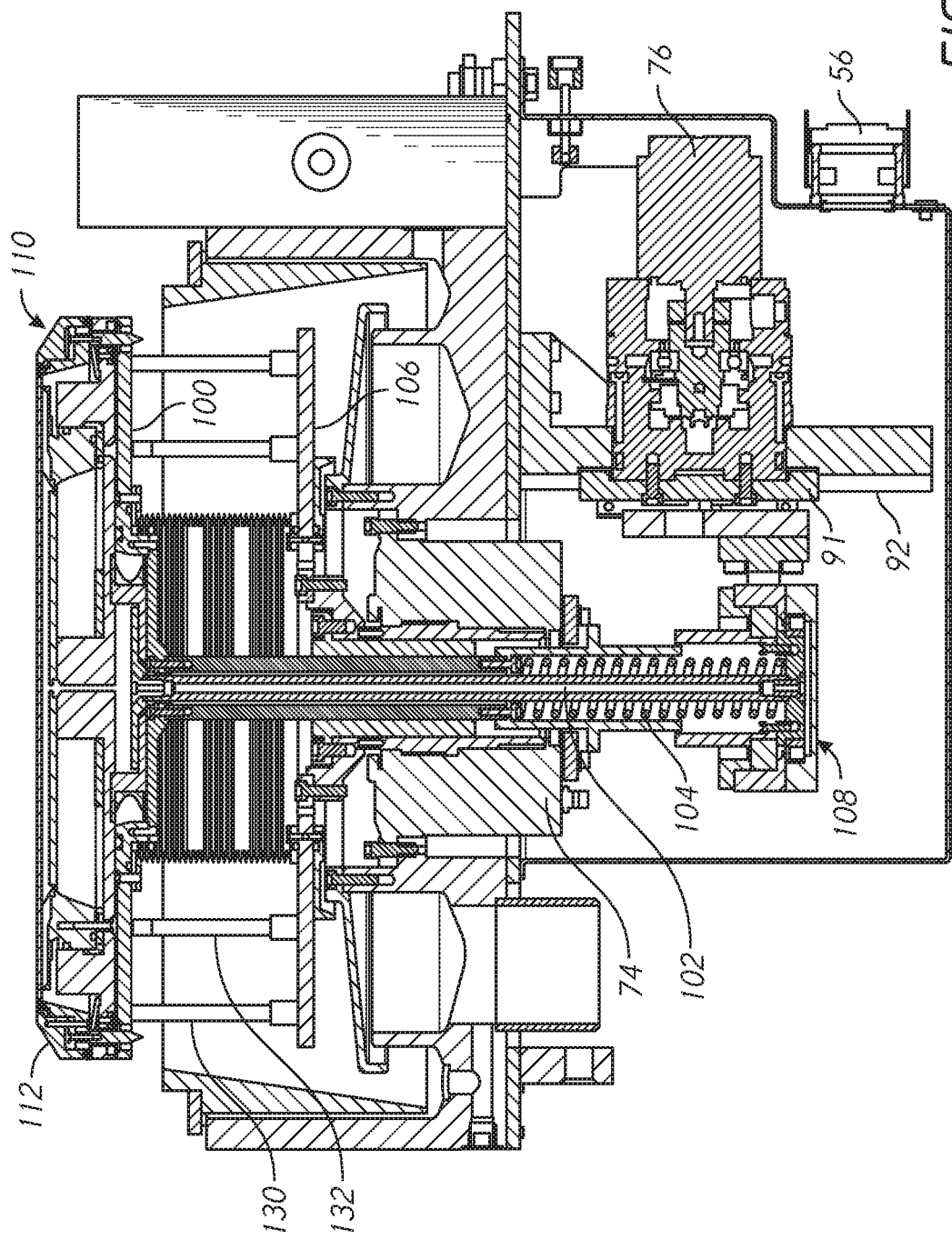
FIG. 8 is a section view of the ring maintenance module of FIGS. 2-4 in a chuck assembly clamping position.

The ring maintenance module 50 may operate as follows. To load a wafer 114 into a chuck assembly 110, the ring maintenance module 50 is in the initial position as shown in FIG. 2, with the weir 64 in the down position, the swing arm 80 in the park position, and the lift assembly 90 in the fully up position. A process robot 44 moves an empty and clean chuck assembly 110 into the ring maintenance module 50, with the chuck fitting 120 engaging the chuck clamp 62, as shown in FIG. 4. The alignment pins 118 on the contact ring 112 are aligned with and extend through holes in the backing plate 116. The lift assembly 90 is lowered via the lift motor 76 and the chuck assembly 110 is clamped onto the upper rotor plate 100, as shown in FIG. 8. The spring 104 pulls the shaft 102 down to exert a constant clamping force on the chuck assembly. The alignment pins 118 project through clearance holes in the upper rotor plate 110.

Figure 9:
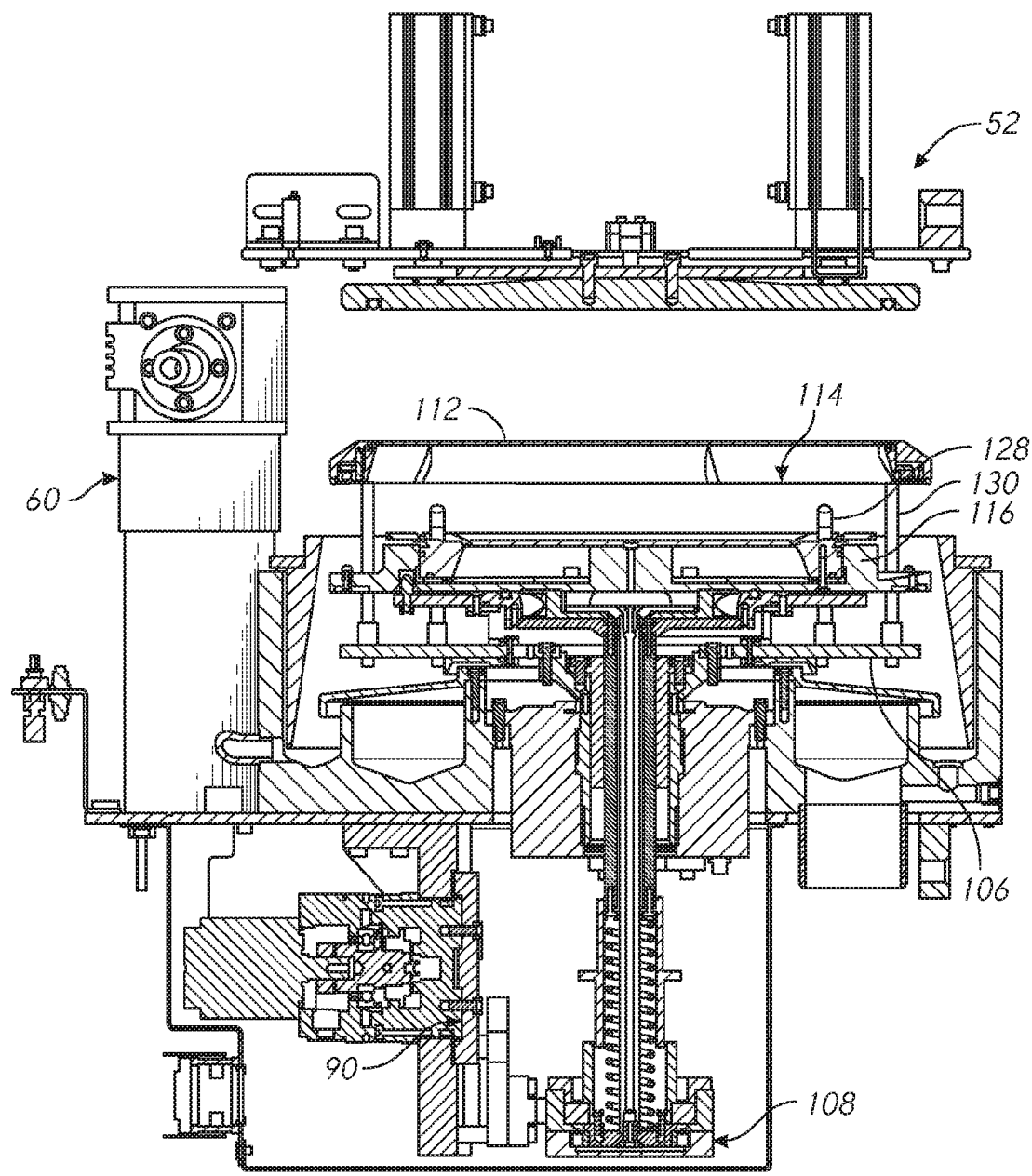
FIG. 9 is a section view of the ring maintenance module of FIG. 8 shown in a wafer loading and unloading position.

Turning to FIG. 9, the lift assembly 90 continues to move down and the contact ring 112 comes to rest on the contact ring standoffs 130. As the lift assembly 90 moves down further, the backing plate 116 is separated from contact ring 112, as the downward pull of the upper rotor plate 100 overcomes the magnetic force holding the backing plate 116 and the contact ring 112 together. The lift assembly 90 moves with the backing plate 116 to the full down position shown in FIG. 9. The wafer robot 48 moves a wafer 114 into the now open chuck assembly 110, with the wafer placed on top of the wafer standoffs 128, and with the wafer centered relative to the backing plate 116.

Figure 14:
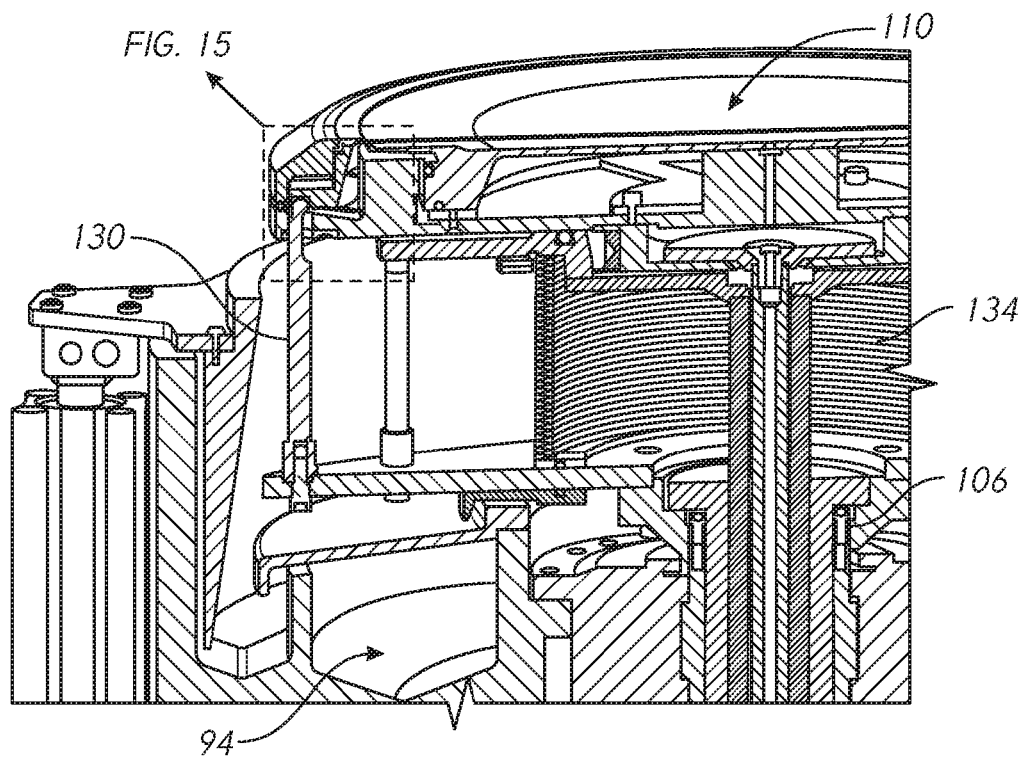
FIG. 14 is a section view of contact ring shown in FIGS. 5-7 engaged by the contact ring standoffs on the rotor plate of the ring maintenance module.
Figure 16:
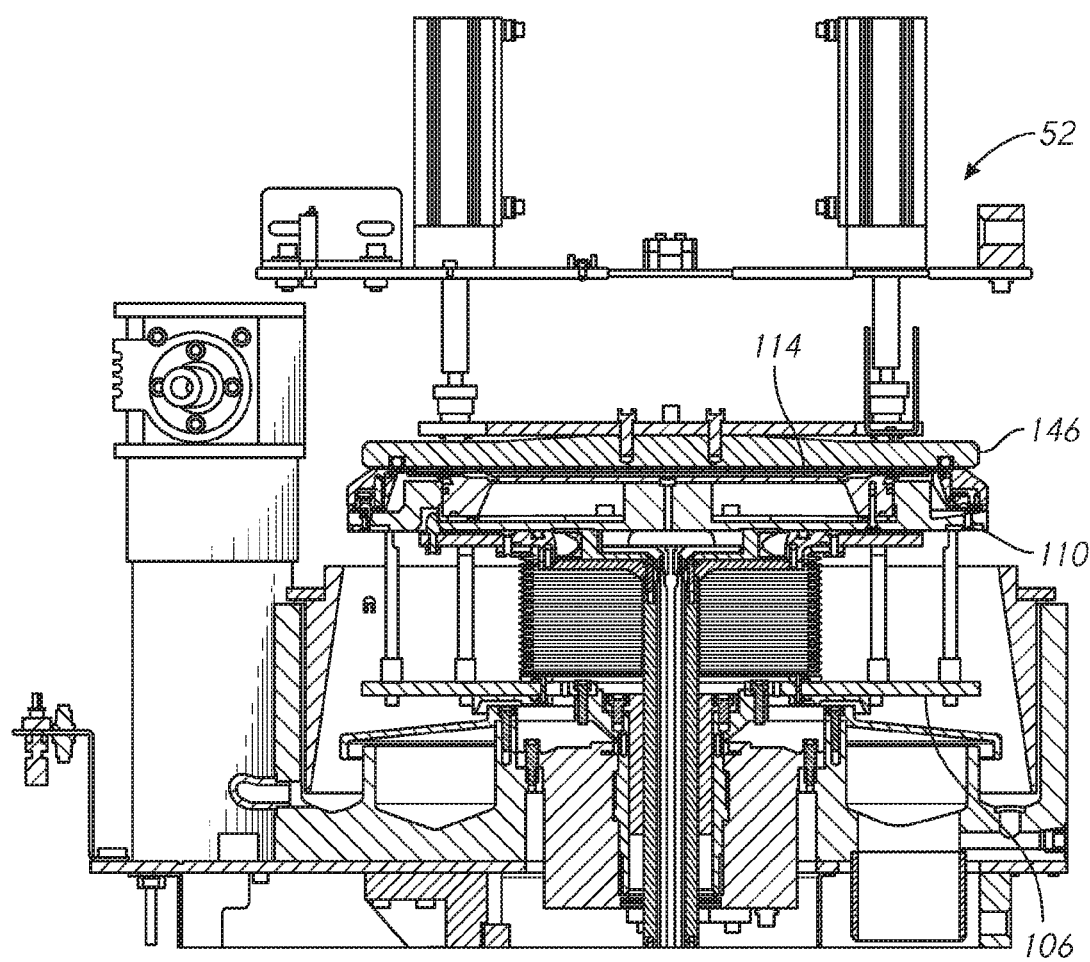
FIG. 16 is a section view of seal test assembly of FIG. 13 engaged with the chuck assembly shown in FIGS. 5-6 in a seal test position.

With the wafer 114 loaded into the chuck assembly 110, the ring maintenance module 50 then closes the chuck assembly by raising the lift assembly 90, moving the backing plate 116 up into contact with the wafer 114. With the wafer resting on the backing plate 116, the lift assembly 90 continues to move up causing the backing plate 116 to rejoin with the contact ring 112 via magnetic attraction, as shown in FIG. 14 (setting aside the seal test assembly 52 in FIG. 16 which is not present or used at this step).

With an unprocessed wafer 114 now loaded into the chuck assembly 110, the ring maintenance module 50 lifts the chuck assembly 110 to its highest or full up position, which is shown in FIG. 4. The process robot 44 then picks up the chuck assembly 110 and moves it into a plating processor 42. The wafer is electroplated to apply a film of conductive material onto the wafer. After electroplating is completed, the process robot 44 returns the chuck assembly 110 holding the plated wafer 114 back to a ring maintenance module 50. The chuck assembly 110 and the wafer 114 may be wet with electroplating liquid.

To remove the now plated wafer 114, the lift assembly 90 is lowered and the backing plate 116 is separated from the contact ring 112. As the backing plate 116 moves down, the wafer 114 comes to rest on the wafer standoff pins 128, as shown in FIG. 9. The wafer 114 may stick to the seal 122 as the backing plate is lowered. To insure that the wafer 114 moves down with the backing plate, vacuum may be applied to the back side of the wafer to hold the wafer to the backing plate, and to overcome any adhesion forces holding the wafer to the seal 122. The robot 48 removes the wafer 114 from the ring maintenance module 50 and carries the wafer back to a container 24. A subsequent unprocessed or unplated wafer 114 may then be loaded into the chuck assembly 100 and the above-described process repeated.

Figure 10:
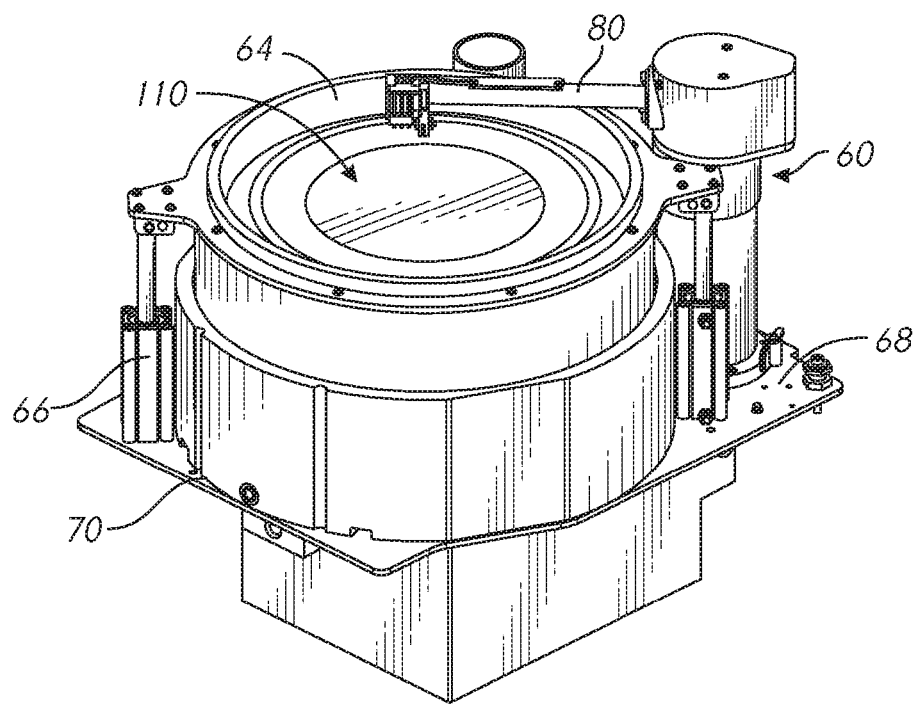
FIG. 10 is a top, rear and right side perspective view of the ring maintenance module in a chuck assembly cleaning process.

The ring maintenance module 50 can clean, rinse and dry a chuck assembly 110, so that the chuck assembly 110 is maintained in good working condition. Generally, a chuck assembly is cleaned after each use. Referring to FIG. 10, an empty chuck assembly 110 may be cleaned by moving the lift assembly 90 to the full up position. The backing plate 116 is engaged with the contact ring 110. The swing arm 80 is pivoted over the chamber formed by the weir 64 and the base 136, and the weir 64 is lifted to an up position via the actuators 66. The nozzles 84 in the head 82 of the swing arm spray out a cleaning or etching liquid chemical, water, and/or gas such as nitrogen. The ring maintenance module 50 may slowly rotate the chuck assembly 110 to better expose the surfaces of the chuck assembly to the cleaning spray. The swing arm may also optionally sweep back and forth during this step.

The spray from the nozzles 84 may be primarily aimed at the seal 122 where potential for contamination is greater. A brush or other mechanical contacting element may be provided on the swing arm to brush the seal 122. After applying cleaning liquid chemical, the ring maintenance module 50 may spray out water during a rinsing step, followed by air or gas in a drying step. The chuck assembly 110 may optionally be partially open or fully open, during the cleaning steps, by adjusting the vertical position of the lift assembly 90.

Figure 11:
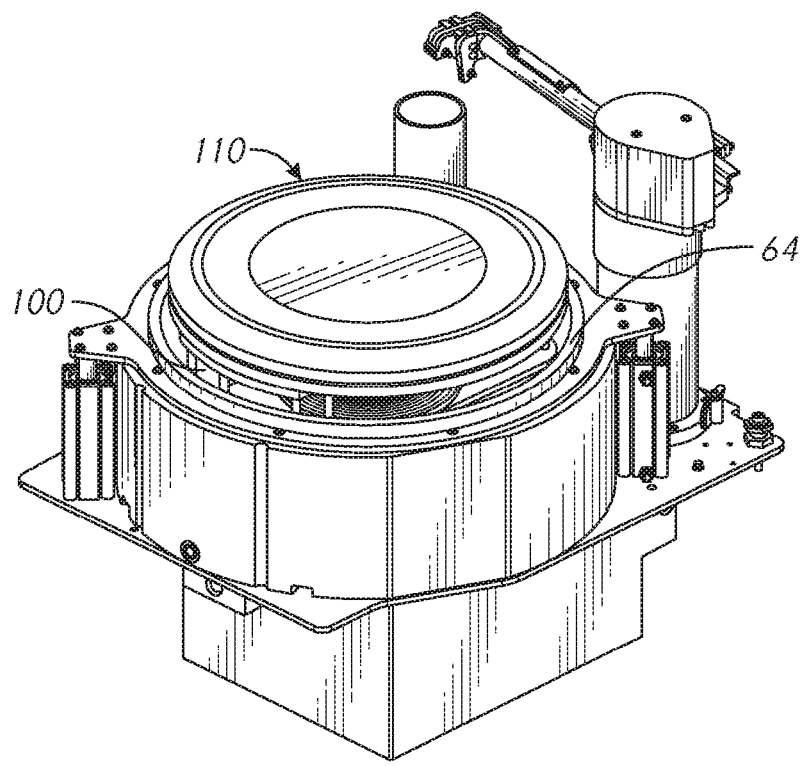
FIG. 11 is a top, rear and right side perspective view of the ring maintenance module in a seal inspection position.
Figure 12:
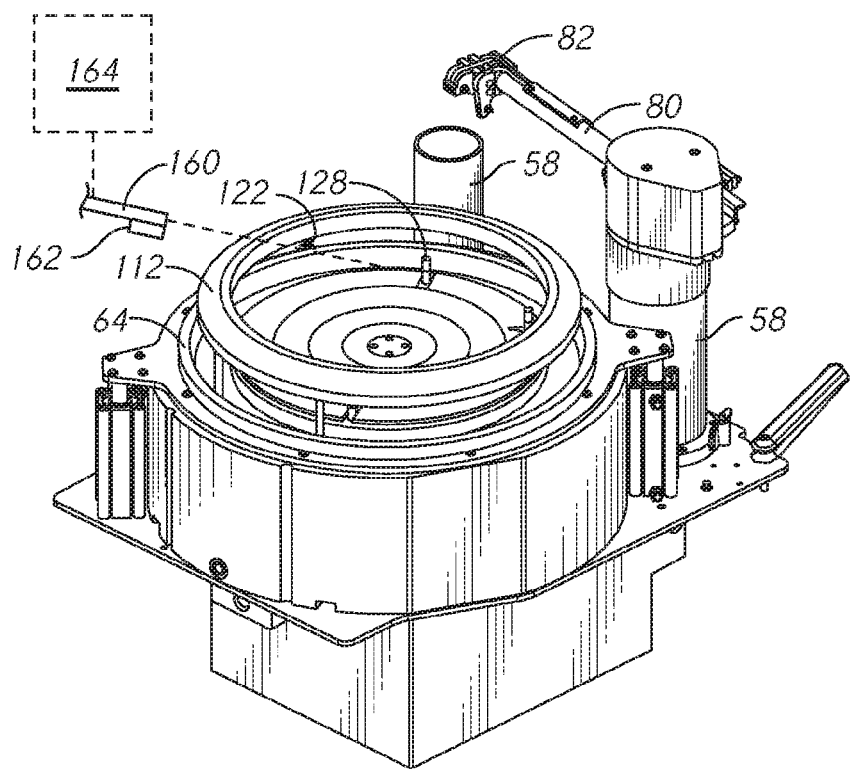
FIG. 12 is a top, rear and right side perspective view of the ring maintenance module in a chuck assembly open position.

As shown in FIG. 11, after the cleaning process, the weir 64 is lowered back to the down position and the swing arm returned to the home position with the nozzles 84 over the dispense cup 58. With the chuck assembly 110 in this position, the ring maintenance module 50 may perform an optical inspection of the seal 122. As shown in FIG. 12, the lift assembly 90 is lowered to separate the backing plate 116 from the contact ring 112. A laser 160 may project across the contact ring 112, focused on the ring seal 122. Reflected or scattered laser light is sensed via one or more detectors 162 and analyzed to determine the presence or absence of metal on the seal 122.

As metal is more highly reflective than the seal itself, the laser system can optically detect metal contamination on the seal. With the contact ring 112 slowly rotating, metal on the seal 122 with cause detectable fluctuations in sensed reflected light. If the seal 122 is free of metal, the sensed reflected light will be relatively more uniform. If metal on the seal is detected, the chuck assembly is removed from use. If no contamination is detected, the chuck assembly 110 in FIG. 12 is in position to be loaded with an unprocessed wafer 114. In an alternative system, a camera may collect and compare images of the seal 122 over time, with the images processed to identify changes indicating a buildup of metal on the seal. In either case, these optical systems may be directed to the rim or vertical tip of the seal which contacts the wafer as shown in FIG. 7. The detector 162 or camera may be linked to a computer 164 for processing the image data and to determine if contamination is detected on the seal 122.

Figure 13:
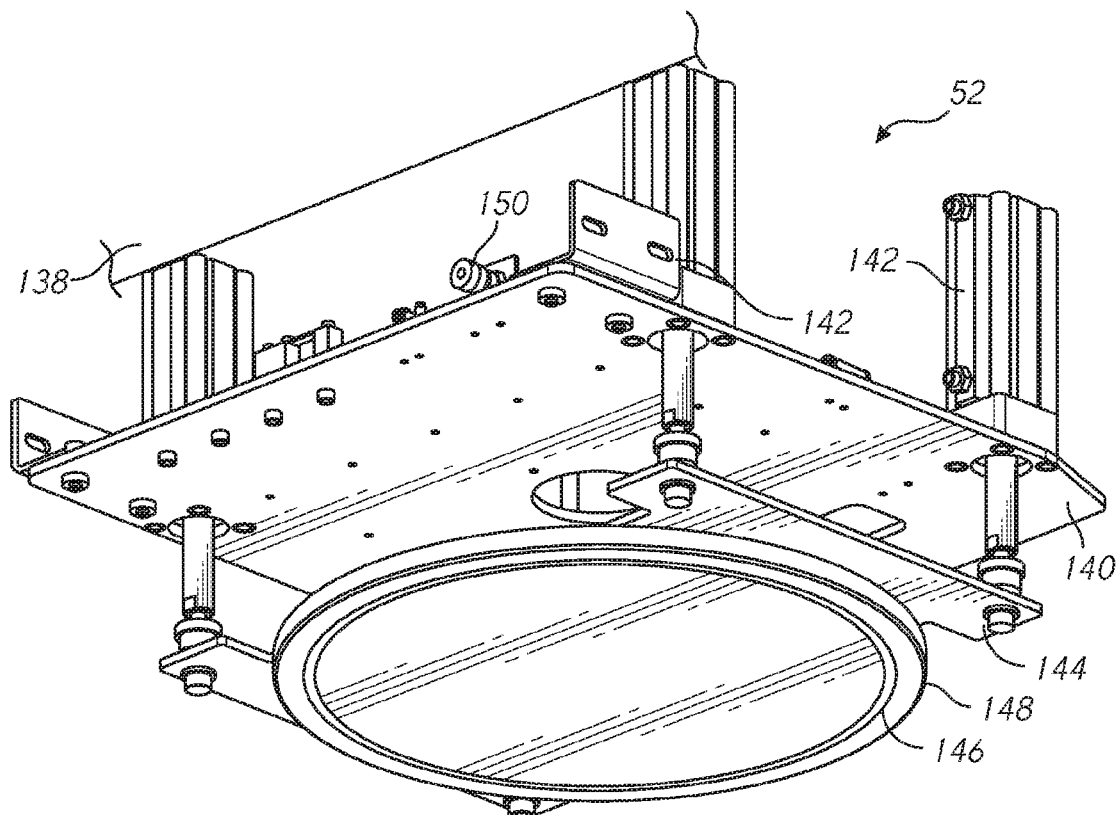
FIG. 13 is a bottom and left side perspective view of a seal test assembly of the ring maintenance module.
Figure 17:
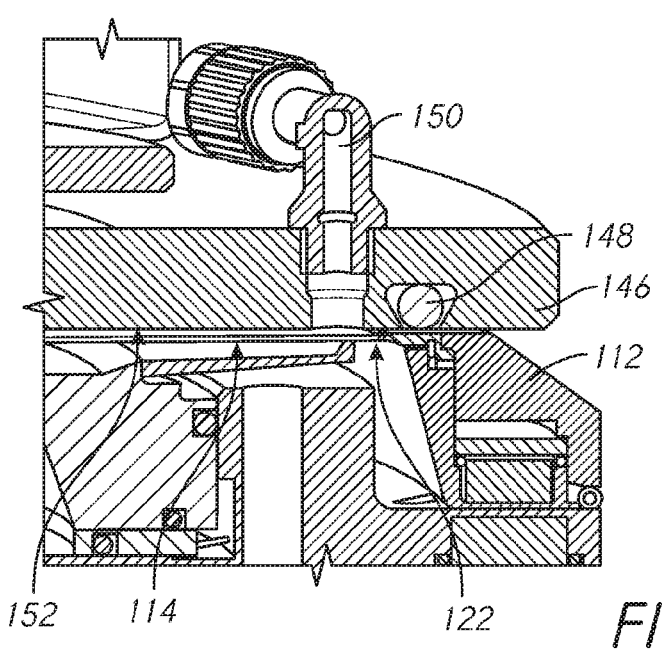
FIG. 17 is an enlarged section view of the pressure plate of the seal test assembly engaged with the chuck assembly.

The optional seal test assembly 52 shown in FIGS. 9, 13 and 14 may include a mounting plate 140 fixed in position on the cabinet 138 and aligned over the ring maintenance module 50. A pressure plate 146 is attached to a push frame 144 which is moveable vertically via linear actuators 142. An o-ring 148 is provided in a recess in the down facing surface of the pressure plate 146. As shown in FIG. 17, a pressurized gas supply port 150 extends through the pressure plate 146, inside of the o-ring 148.

Figure 15:
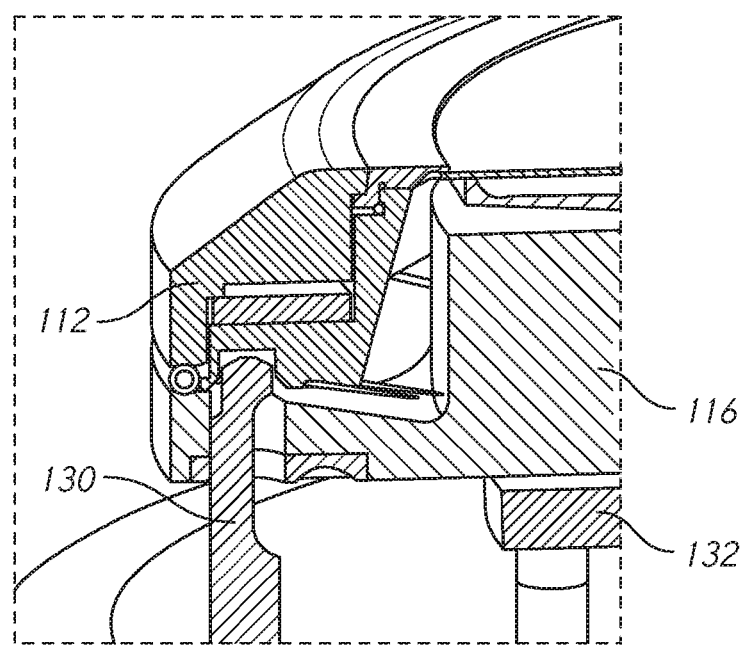
FIG. 15 is an enlarged section view detail of the contact ring standoff shown in FIG. 14.

The seal 122 of the contact ring 112 may be pressure tested by loading a wafer 114 into the chuck assembly 110, as shown in FIG. 9. The chuck assembly 110 is open, the swing arm is in the parked position, the pressure plate 146 is in the up position, the weir 64 is in the down position, and the lift assembly 90 is indexed for chuck assembly loading. As shown in FIG. 9, a wafer 114 is loaded into the open chuck assembly via the wafer robot 48. The lift assembly 90 is raised to close the chuck assembly 110. The lift assembly 90 continues to move up to a seal pressure check position, where the contact ring 112 is lifted 1-2 mm up off of the contact ring standoffs 130, as shown in FIGS. 14 and 15.

The pressure plate 146 is then moved down via the actuators 142, with the o-ring 148 moving into contact with the top surface of the contact ring 112, as shown in FIG. 17. This creates a test volume of space 152 above the wafer 114 and below the pressure plate 146, with the space 152 sealed by the o-ring 148 on the top surface and by the seal 122 on the bottom surface. Sensors on the actuators 142 may be used to verify that the pressure plate 146 is at the proper position. Pressurized gas, such as nitrogen, is supplied into the space 152 via the port 150. Within a few seconds, the pressure will equalize. If the seal 122 is good, a mass flow meter in the pressurized gas supply will show a gas flow rate at or near zero. If the seal 122 is leaking, the mass flow meter will show a significant flow rate. If the chuck assembly 110 successfully passes the seal pressure test, the chuck assembly 110 is used for wafer processing, as described above. If the chuck assembly fails the seal pressure test, the chuck assembly 110 may be opened and closed and the test repeated. If the chuck assembly still does not pass, the seal 122 is likely not capable of properly sealing against a wafer in actual use and the chuck assembly is removed from use.

Thus, novel methods and systems have been shown and described. Various changes and substitutions may of course be made without departing from the spirit and scope of the invention. The invention, therefore, should not be limited, except by the following claims and their equivalents.

The invention claimed is:

1. Apparatus comprising:
   an enclosure;
   a lift assembly within the enclosure, with the lift assembly including an upper rotor plate and a shaft attached to the upper rotor plate and rotated by a rotation motor, with an upper end of the shaft connected to a chuck clamp;
   a lower rotor plate connected for rotation with the shaft; and
   a lift motor connected to the lift assembly for lifting and lowering the lift assembly to move the upper rotor plate vertically relative to the lower rotor plate; and
   a swing arm having one or more spray nozzles, with the swing arm movable from a first position above the lift assembly, to a second position off to one side of the lift assembly.

2. The apparatus of claim 1 further comprising three or more contact ring standoffs on the lower rotor plate aligned with outer through holes in the upper rotor plate, and three or more wafer standoffs on the lower rotor plate aligned with inner through holes in the upper rotor plate.

3. The apparatus of claim 1 further including a tension spring urging the shaft downward.

4. The apparatus of claim 1 further including a weir within the enclosure, and a weir lift actuator connected to the weir for lifting and lowering the weir.

5. The apparatus of claim 1 further including a seal test assembly positioned above the rotor plate and having a pressure plate including a pressure plate seal and a gas port, with the pressure plate seal adapted to seal against a top surface of a contact ring of a chuck assembly supported on the rotor plate.

6. The apparatus of claim 1 further including a chuck assembly held onto the shaft, with the chuck assembly having a contact ring having a seal, with the contact ring attachable to a backing plate, and the backing plate having a chuck fitting engaged with the chuck clamp.

7. The apparatus of claim 6 with the upper rotor plate moveable to a load/unload position wherein the contact ring is supported on contact ring standoffs attached to the lower rotor plate and is separated from the backing plate.

8. The apparatus of claim 6 further including a laser directed at the seal, and one or more sensors for sensing light reflected from the seal.

9. The apparatus of claim 1 further including magnets attaching the backing plate to the contact ring.

10. Apparatus comprising:
an enclosure;
a lift assembly within the enclosure, with the lift assembly including an upper rotor plate and a shaft attached to the upper rotor plate and rotated by a rotation motor, with an upper end of the shaft connected to a chuck clamp;
a lift motor connected to the lift assembly for lifting and lowering the lift assembly; and
a seal test assembly positioned above the upper rotor plate and having a pressure plate including a pressure plate seal and a gas port, with the pressure plate seal adapted to seal against a top surface of a contact ring of a chuck assembly supported on the upper rotor plate.

11. The apparatus of claim 10 further including a swing arm having one or more spray nozzles, with the swing arm movable from a first position above the lift assembly, to a second position off to one side of the lift assembly.

12. The apparatus of claim 10 further including a weir within the enclosure, and a weir lift actuator connected to the weir for lifting and lowering the weir.

13. The apparatus of claim 10 with the chuck assembly held onto the shaft, and the chuck assembly including a contact ring attachable to a backing plate having a chuck fitting engaged with the chuck clamp, with the lift assembly moveable to a load/unload position wherein the contact ring is supported on contact ring standoffs and is separated from the backing plate.

14. The apparatus of claim 13 with the contact ring having a seal, further including a laser directed at the seal, and one or more sensors for sensing light reflected from the seal.

15. The apparatus claim 13 with the contact ring standoffs on a lower rotor plate attached to the shaft, with the contact ring standoffs aligned with outer through holes in the upper rotor plate, and three or more wafer standoffs on the lower rotor plate aligned with inner through holes in the upper rotor plate, and with the upper rotor plate vertically moveable relative to the lower rotor plate via operation of the lift motor.

16. Apparatus comprising:
an enclosure;
a lift assembly within the enclosure, with the lift assembly including an upper rotor plate and a shaft attached to the upper rotor plate and rotated by a rotation motor, with an upper end of the shaft connected to a chuck clamp;
a lift motor connected to the lift assembly for lifting and lowering the lift assembly;
a chuck assembly held onto the shaft, with the chuck assembly having a contact ring attachable to a backing plate, the contact ring having a seal and the backing plate having a chuck fitting engagable with the chuck clamp;
the lift assembly moveable to a load/unload position wherein the contact ring is separated from the backing plate; and
a swing arm having one or more spray nozzles, with the swing arm movable from a first position above the lift assembly, to a second position off to one side of the lift assembly.

17. The apparatus of claim 16 further including a lower rotor plate connected for rotation with the shaft, and with the upper rotor plate vertically moveable relative to the lower rotor plate via operation of the lift motor, and further including contact ring standoffs attached to the lower rotor plate.

18. The apparatus claim 17 with the contact ring standoffs aligned with outer through holes in the upper rotor plate, further including three or more wafer standoffs on the lower rotor plate aligned with inner through holes in the upper rotor plate.

* * * * *